United States Patent
Narita et al.

(10) Patent No.: US 9,559,253 B2
(45) Date of Patent: Jan. 31, 2017

(54) METHOD OF MANUFACTURING NITRIDE SEMICONDUCTOR ELEMENT

(71) Applicant: NICHIA CORPORATION, Anan-shi (JP)

(72) Inventors: Junya Narita, Yoshinogawa (JP); Yohei Wakai, Anan (JP); Kazuto Okamoto, Tokushima (JP); Mizuki Nishioka, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 83 days.

(21) Appl. No.: 14/526,740

(22) Filed: Oct. 29, 2014

(65) Prior Publication Data

US 2015/0118775 A1    Apr. 30, 2015

(30) Foreign Application Priority Data

Oct. 29, 2013 (JP) .................... 2013-223810

(51) Int. Cl.
*H01L 21/28* (2006.01)
*H01L 33/00* (2010.01)

(52) U.S. Cl.
CPC .................. *H01L 33/0095* (2013.01)

(58) Field of Classification Search
CPC ................................. H01L 33/0095
USPC .............. 438/602–609, 58; 257/E21.318
See application file for complete search history.

(56) References Cited

U.S. PATENT DOCUMENTS

| 2007/0176181 | A1* | 8/2007 | Kusunoki | B28D 5/0011 257/79 |
| 2007/0298529 | A1 | 12/2007 | Maeda et al. | |
| 2014/0353705 | A1* | 12/2014 | Kamikawa | H01L 33/007 257/98 |

FOREIGN PATENT DOCUMENTS

| JP | 2008-98465 | 4/2008 |
| JP | 2010-239005 | 10/2010 |
| JP | 2013-131697 | 7/2013 |

* cited by examiner

*Primary Examiner* — H Tsai
(74) *Attorney, Agent, or Firm* — Mori & Ward, LLP

(57) ABSTRACT

A method of manufacturing a nitride semiconductor element includes preparing a wafer having a nitride semiconductor layer which includes p-type dopants, forming an altered portion by condensing laser beam on the wafer, and after the forming an altered portion, forming a p-type nitride semiconductor layer by subjecting the wafer to annealing.

23 Claims, 3 Drawing Sheets

METHOD OF MANUFACTURING NITRIDE SEMICONDUCTOR ELEMENT

BACKGROUND

1. Technical Field

The present disclosure relates to a method of manufacturing a nitride semiconductor element.

2. Background Art

Semiconductor light emitting elements such as light emitting diodes (hereinafter may be referred to as "LEDs"), laser diodes (hereinafter may be referred to as "LDs") have a small size and good power efficiency, and emit light of bright colors, and have been used for various light sources. Semiconductor light emitting elements are attracting attention as next-generation lighting because of their low energy consumption and long life, and further improvement in light output power and luminous efficiency have been required.

Of those semiconductor light emitting elements, a manufacturing of particularly nitride semiconductor elements includes dividing a wafer which is a nitride semiconductor stacked on a substrate into individual nitride semiconductor elements. In recent years, a laser dicing technology has been employed in a dividing process, in which a laser beam is focused on a surface or an inner portion of an objective material (for example, a wafer) to form an altered portion which is to serve as a division starting point, and an external force is applied to generate a dividing groove or a crack to split the wafer.

See JP 2008-98465A.

However, not only in the case where the laser beam is irradiated from the nitride semiconductor layer side but also in the case where the laser beam is irradiated from the substrate side, damage to the nitride semiconductor layer caused by the laser beam which passed the wafer has been of concern. Such damage includes, regardless of a scar in the appearance of the nitride semiconductor layer, a state in which the nitride semiconductor layer does not normally function. A damaged nitride semiconductor layer may lead to leakage and/or a low-voltage breakdown. Such influence of a laser beam on a nitride semiconductor layer can be reduced by reducing the laser output or reducing the number of irradiation of the laser beam, but on the other hand, an increase in the tact time and/or a decrease in yield due to occurrence of an undivided portion at the time of dividing the wafer or due to ununiform shapes after dividing the wafer may occur. Further, the greater the thickness of the wafer, the greater the laser beam output needed to divide the wafer, which also increases the number of irradiation of the laser beam. For the reasons described above, the possibility of damaging the semiconductor layer increases.

The present disclosure is provided to solve the problems described above, and an aim thereof is to reduce damage of the nitride semiconductor layer caused by a laser beam.

SUMMARY

A method of manufacturing a nitride semiconductor element includes preparing a wafer having a nitride semiconductor layer which includes p-type dopants, forming an altered portion by focusing laser beam on the wafer, and after the forming an altered portion, forming a p-type nitride semiconductor layer by subjecting the wafer to annealing.

According to the embodiments of the present invention, damage of a nitride semiconductor layer caused by a laser beam can be reduced.

DETAILED DESCRIPTION OF THE EMBODIMENTS

Figure 1:
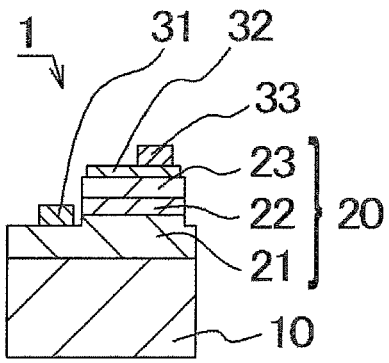
FIG. 1 is a schematic cross-sectional view of a light emitting device according to an embodiment of the present invention.

The embodiments according to the present invention will be described below with reference to the drawings.

The drawings referred to in the description below are to schematically illustrate the embodiments, and the size, a space or interval, locational relationship of the components may be exaggerated or a portion of a component may not be shown. Also, the size and/or space or interval of components may not be the same between a plan view and a cross-sectional view. In the description below, the same designations or the same reference numerals denote the same or like members and duplicative descriptions will be appropriately omitted.

Embodiments

Structure of Nitride Semiconductor Element

The structure of a nitride semiconductor element according to Embodiment 1 fabricated by using the method to be described below, will be described with reference to FIG. 1. The nitride semiconductor element 1 according to Embodiment 1 is a nitride semiconductor element for face-up or flip-chip mounting. The nitride semiconductor element 1 includes a substrate 10, a nitride semiconductor layer 20 stacked on the substrate 10, an n-side electrode 31, a whole surface electrode 32, and a p-side electrode 33. The nitride semiconductor layer 20 includes an n-type nitride semiconductor layer 21, an active layer 22, and a p-type nitride semiconductor layer 23. In a plan view, from portions of the surface of the nitride semiconductor layer 20, the p-type nitride semiconductor layer 23 and the active layer, and a portion of the n-type nitride semiconductor layer 21 are removed in a depth direction. With this arrangement, a step portion which is to be a region for disposing an n-side electrode 31 is formed in the n-type nitride semiconductor layer 21. The n-side electrode 31 is electrically connected to the n-type nitride semiconductor layer 21. The whole surface electrode 32 and the p-side electrode 33 are disposed on the p-type nitride semiconductor layer 23, and are electrically connected to the p-type nitride semiconductor layer 23.

Further, the upper surface of the nitride semiconductor element 1 is covered with a protective layer except for a portion for connecting to an external power source.

In the specification, the term "upper" corresponds to a direction perpendicular to a stacked-surface of a nitride semiconductor layer 20, that is, a stacked direction of the nitride semiconductor layer 20. For example, in FIG. 1, the term "upper" indicates an upward direction in the figure.

In the specification, the term "on", such as used in "on the layer" etc. includes not only a case where a component is in contact with the layer, but also a case where a component is located above and apart from the layer and also a case where an interposing layer exists between the layers.

Substrate

The material of the substrate 10 allows for epitaxial growth of a nitride semiconductor layer 20, and the size, the thickness, or the like is not specifically limited. For example, the thickness of the substrate 10 may be 80 μm to 800 μm. The substrate 10 may have a plurality of protrusions at a side where the nitride semiconductor layer 20 is stacked. Examples of the materials of the substrate include an insulating substrate such as a sapphire with a principal plane being C-plane, R-plane, or A-plane, and a spinel ($MgAl_2O_4$); and silicon carbide (SiC), silicon, ZnS, ZnO, GaAs, and diamond.

Nitride Semiconductor Layer

For the nitride semiconductor layer 20, for example, a semiconductor material represented by a general formula $Al_xIn_yGa_{1-x-y}N$ ($0 \leq x \leq 1$, $0 \leq y \leq 1$, $x+y \leq 1$) can be used, and a gallium nitride-based compound semiconductor can be preferably used. The nitride semiconductor layer 20 has a stacked layer structure, which includes an n-type nitride semiconductor layer 21, an active layer 22, and a p-type nitride semiconductor layer 23 stacked in this order on a substrate 10. The n-type nitride semiconductor layer 21, the active layer 22, and the p-type nitride semiconductor layer 23 may respectively have a single-layer structure, but also may have a stacked-layer structure, a superlattice structure, or the like, which are made of layers of different compositions and thickness. Particularly, the active layer 22 which serves as the light emitting layer preferably has a single quantum well structure or a multiquantum well structure which is made of stacked layer of thin layers each can produce quantum effect. Further, the well layer preferably includes a nitride semiconductor which contains In. The n-type nitride semiconductor layer 21 may be optionally formed on the substrate 10 via an under layer such as a buffer layer to reduce mismatching of a lattice constant with the substrate 10.

The n-type nitride semiconductor layer 21 contains n-type dopants, which may be at least one element of Group-IV elements, Group VI elements, or the like, such as Si, Ge, Sn, S, O, Ti, Zr, Cd, and particularly Si is preferable. The p-type nitride semiconductor layer 23 contains p-type dopants such as Mg or Zn, particularly Mg is preferable. The concentration of the n-type dopants and the p-type dopants are preferably $5 \times 10^{16}/cm^3$ to $5 \times 10^{21}/cm^3$, particularly, the concentration of the p-type dopants such as Mg are preferably $5 \times 10^{18}/cm^3$ to $5 \times 10^{21}/cm^3$.

N-Side Electrode, P-Side Electrode

The n-side electrode 31 and the p-side electrode 33 are pad electrodes. The n-side electrode 31 is electrically connected to the n-type nitride semiconductor layer 21, and the p-side electrode 33 is electrically connected to the p-type nitride semiconductor layer 23 via a whole surface electrode 32, to supply external electric current to the nitride semiconductor element 1. The materials of the n-side electrode 31 and the p-side electrode 33 can be appropriately selected in view of contacting with the nitride semiconductor layer 20 and light-reflecting properties. For example, a single-layer structure or a multilayer structure can be employed with the use of Al, Ti, Ni, Au, Pt, Rh, Cr, or an alloy containing at least one of such metals.

Whole Surface Electrode

A whole surface electrode 32 is disposed on the p-type nitride semiconductor layer 23 so as to cover approximately entire surface of the p-type nitride semiconductor 23, and serves to uniformly diffuse the current which is supplied from outside through the p-side electrode 33 onto the whole surface of the p-type nitride semiconductor layer 23. There are various types of whole surface electrode 32. In the case where the nitride semiconductor element 1 is mounted in a face-up manner, light emitted from the active layer 22 is extracted in an upward direction, so that, for example, a light-transmissive electrode may be preferably employed. For the whole surface electrode 32, a light transmissive electrode which includes an oxide of Zn, In, Sn, such as ITO, ZnO, $In_2O_3$, $SnO_2$ can be suitably used. Particularly, ITO is preferable for its high light transmissivity and good current dispersing properties and good contacting properties with the nitride semiconductor layer 20 (p-type nitride semiconductor layer 23). In the case where the nitride semiconductor element 1 is mounted in a flip-chip manner, the whole surface electrode 32 also serves as a reflecting layer to reflect light emitted from the active layer 22 to the back surface-side of the substrate 10 which serves as the light extracting surface. Accordingly, for the whole surface electrode 32, a material which has a high light reflectance such as Ag, Al, or Rh may be preferably used. The whole surface electrode 32 and the p-side electrode 33 may be formed with either different members or the same member, respectively, and the whole surface electrode 32 may be omitted. Also, an electrode made of the same material as the whole surface electrode 32 can be disposed between the n-type nitride semiconductor layer 21 and the n-side electrode 31.

Method of Manufacturing Nitride Semiconductor Element

The structure of a nitride semiconductor element according to Embodiment 1 fabricated by using the method to be described below, will be described with reference to FIGS. 2-7.

A method of manufacturing a nitride semiconductor element according to the present embodiment includes preparing a wafer having a nitride semiconductor layer which includes p-type dopants, forming an altered portion by focusing laser beam on the wafer, and after the forming an altered portion, forming a p-type nitride semiconductor layer by subjecting the wafer to annealing.

Forming Nitride Semiconductor Layer

Figure 2:
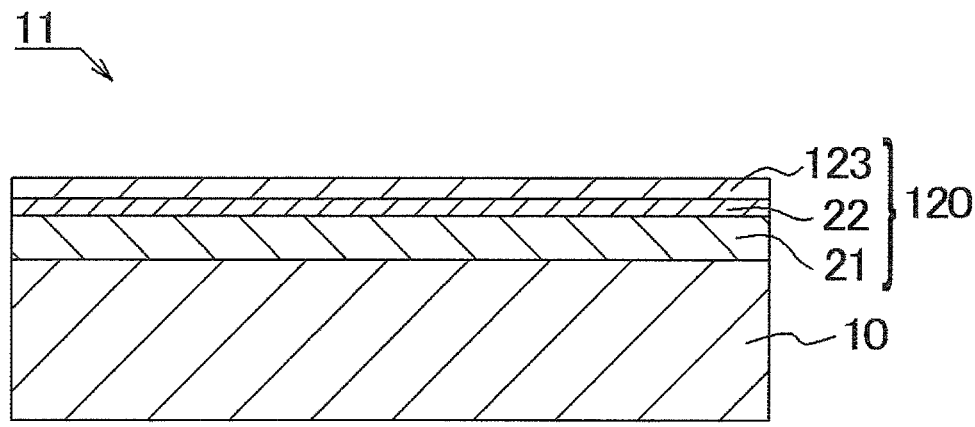
FIG. 2 is a schematic cross-sectional view illustrating a process of a method of manufacturing according to an embodiment of the present invention.

First, as shown in FIG. 2, using a metal organic vapor phase epitaxy method (MOVPE), a nitride semiconductor layer 120 which contains an n-type nitride semiconductor layer 21, an active layer 22, and a nitride semiconductor layer 123 which contains p-type dopants are grown on a substrate 10 to prepare a wafer 11. That is, the wafer 11 has the substrate 10, the n-type nitride semiconductor layer 21, the nitride semiconductor layer 123 which contains the p-type dopants in this order. It should be noted that the method for growing the nitride semiconductor layer 120 is not specifically limited and a known method can be employed.

Forming N-Side Electrode, Whole Surface Electrode, and P-Side Electrode

Figure 3:
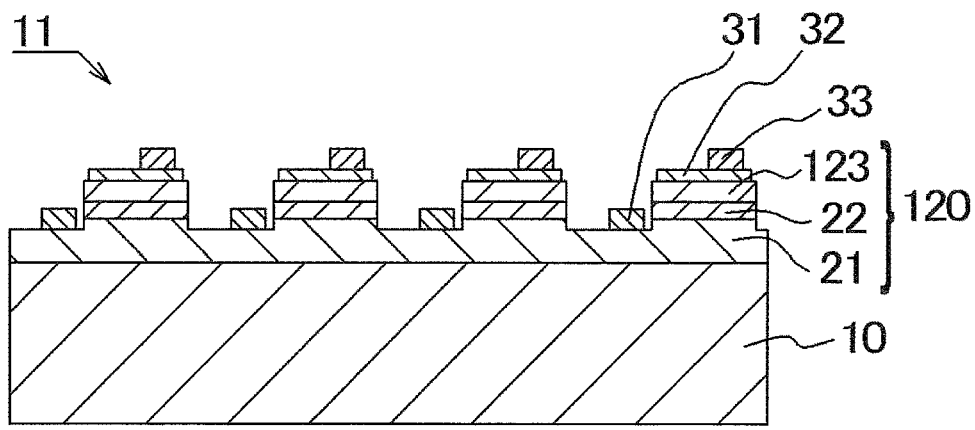
FIG. 3 is a schematic cross-sectional view illustrating a process of a method of manufacturing according to an embodiment of the present invention.

Next, as shown in FIG. 3, step-shaped portions for disposing n-side electrodes 31 and dividing regions for dividing into nitride semiconductor elements 1 are exposed. A mask of a predetermined shape is formed on the wafer 11 by using photoresist. With the use of a reactive ion etching (RIE), from the predetermined portions of the wafer 11 in a plan view, in the thickness direction, the nitride semiconductor layer 123 which contains the p-type dopants, the active layer 22, and a part of the n-type nitride semiconductor layer 21 are removed to expose remaining the portions of the n-type nitride semiconductor layer 21. After etching, the resist layer is removed.

Next, on the nitride semiconductor layer 123 which contains the p-type dopants, a whole surface electrode 32 is formed through patterning. Then, an n-side electrode 31 is formed on each step-shaped portion of the n-type nitride semiconductor layer 21 and a p-side electrode 33 is formed on each of the respective portions of the whole surface electrode 32 through patterning. At this time, forming the p-side electrode 31 and the p-side electrodes 33 with the same material and at the same time can shorten the manufacturing process.

Grinding Substrate

Figure 4:
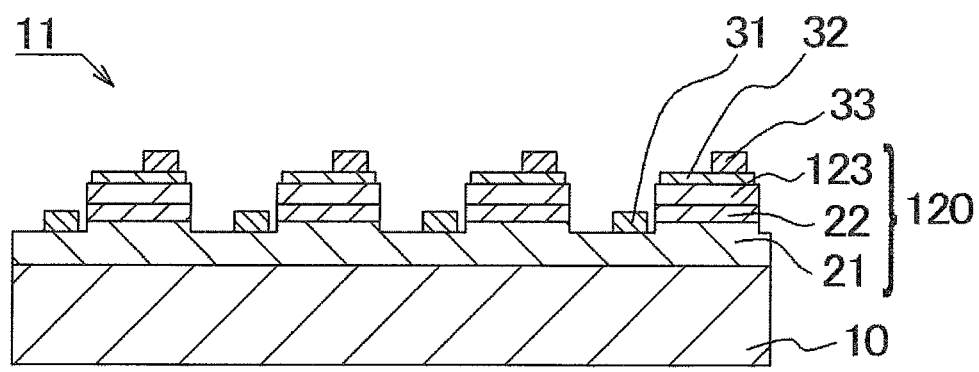
FIG. 4 is a schematic cross-sectional view illustrating a process of a method of manufacturing according to an embodiment of the present invention.

Next, as shown in FIG. 4, the substrate 10 is grind and polished by known process so that the substrate 10 has a thickness of 80 to 200 µm. At this point, it is preferable to form the substrate 10 with a thickness of 150 µm or greater, because warpage of the wafer 11 can be prevented.

Laser Scribing

Figure 5:
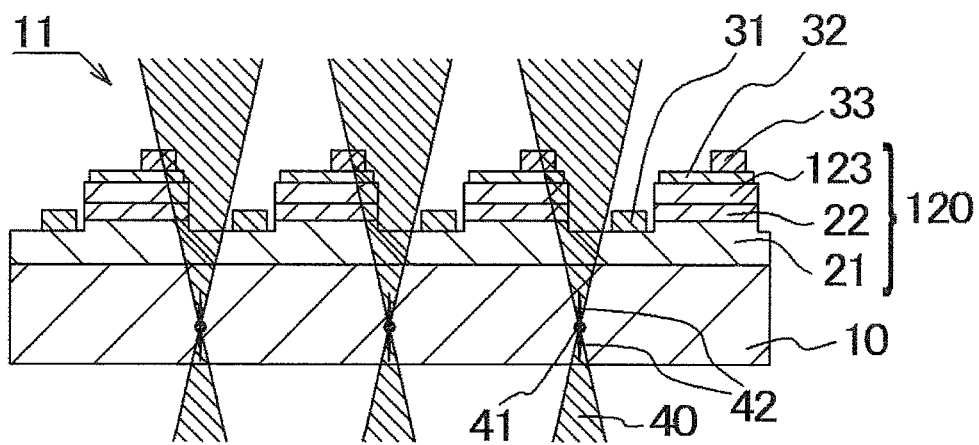
FIG. 5 is a schematic cross-sectional view illustrating a process of a method of manufacturing according to an embodiment of the present invention.

Next, as shown in FIG. 5, a laser beam is irradiated from above the wafer 11, along the predetermined dividing lines for obtaining individual nitride semiconductor elements 1. In order to prevent the laser beam from directly irradiating on the nitride semiconductor layer 120, the laser beam is preferably irradiated from the substrate 10 side of the wafer 11. The laser beam can be concentrated on the surface or at a desired depth of the wafer 11 (preferably the substrate 10), so that altered portions 41 can be formed at each light-condensing portions. In the specification, the altered portions 41 refers to portions of the wafer 11 such as grooves, melted portions, gaps, burnt portions, and discolored portions, which are created by a laser beam irradiation, and can no more maintain the initial state (state prior to the laser irradiation). The altered portions 41 can serve as the starting points of braking.

In the case where the laser beam is irradiated inside the wafer 11, cracks 42 can be generated in the upward and down ward directions from the altered portions 41 formed by the irradiation.

A pulse laser can be suitably used for the laser beam preferably with the pulse width of nanosecond order or less, and more preferably, picosecond order or less. More specifically, the pulse width of 100 femtoseconds to 500 nanoseconds is more preferable, and 100 picoseconds or less is further preferable. By employing such configuration, the altered portions 41 made by multiphoton absorption can be formed, resulting in facilitating brakes of the wafer 11. Such a laser beam with shorter pulse has higher energy density and tends to damage the nitride semiconductor layer 120, yet a damage to the nitride semiconductor layer 120 can be reduced since the laser irradiation is conducted before annealing to be described below.

Annealing of Nitride Semiconductor Layer

Figure 6:
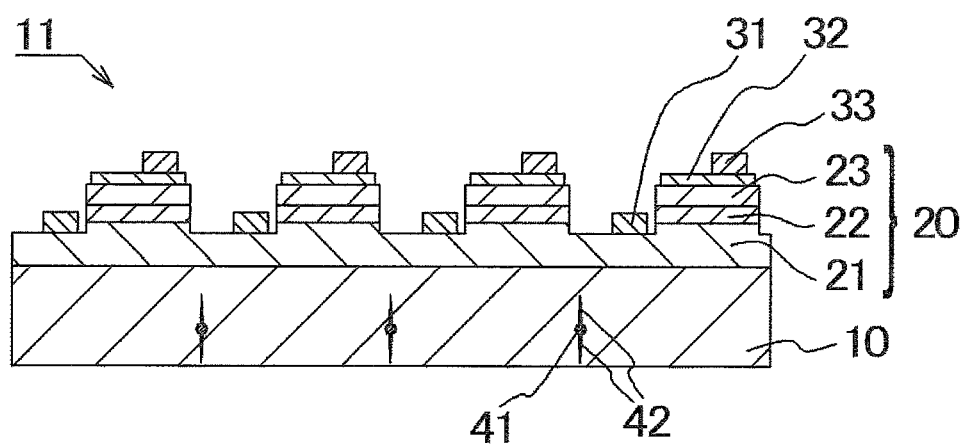
FIG. 6 is a schematic cross-sectional view illustrating a process of a method of manufacturing according to an embodiment of the present invention.

After laser scribing, as shown in FIG. 6, annealing is performed on the wafer 11 to reduce the resistance of the nitride semiconductor layer 123 which contains the p-type dopants to form a p-type nitride semiconductor layer 23, and thus obtain the nitride semiconductor layer 20. Annealing is, for example, performed in a nitrogen atmosphere for several minutes to several tens of minutes at a temperature about 400 to 600° C. thus heat treating the wafer 11. In annealing, it is not necessary to maintain a constant temperature, rather the temperature may be appropriately raised or lowered.

Dividing Wafer

Figure 7:
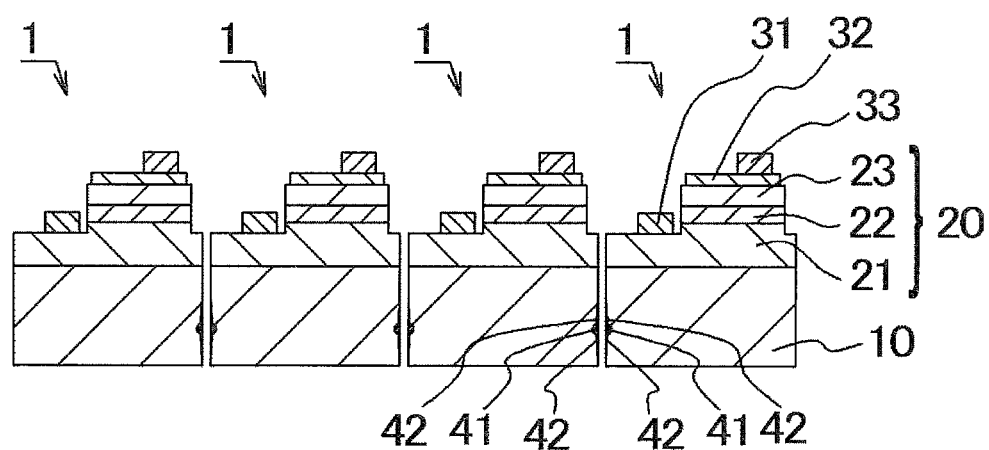
FIG. 7 is a schematic cross-sectional view illustrating a process of a method of manufacturing according to an embodiment of the present invention.

At the ends, as shown in FIG. 7, the wafer is divided by dicing or breaking to obtain individual nitride semiconductor elements 1. By applying an external force to the wafer 11, the wafer 11 can be easily divided from the cracks generated at the time of forming the altered portions 4. The external force may be applied from the substrate 10 side of the wafer 11, or may be applied from both the substrate 10 side and the nitride semiconductor layer 20 side of the wafer 11.

It should be noted that the order of the processes to be performed is not particularly limited, as long as laser scribing (laser irradiation to the nitride semiconductor layer 120) is performed prior to annealing of the nitride semiconductor layer 120.

In order to confirm the effects of the method of manufacturing a nitride semiconductor element described above, the inventors conducted studies on the relationship between the damage of the nitride semiconductor layer caused by the laser light irradiation and presence/absence of annealing processing prior to the laser irradiation. For the study, the samples 1 to 3 were prepared as described below.

Sample 1

A wafer in which a nitride semiconductor layer which contains Si as n-type dopants (n-type nitride semiconductor layer), an active layer, a nitride semiconductor layer which contains Mg (magnesium) as p-type dopants are stacked in this order on a sapphire substrate, was prepared. In a plan view, from a part of the surface of the nitride semiconductor layer, the nitride semiconductor layer which contains p-type dopants, the active layer, and a portion of the n-type nitride semiconductor layer were removed in the depth direction, with the use of etching, to form a step-shaped portion where the remaining n-type nitride semiconductor layer is exposed. Then, an n-side electrode of Ti/Rh/W/Au stacked in this order is disposed on the step-shaped portion to electrically connected to the n-type nitride semiconductor layer, and a p-side electrode of Ti/Rh/W/Au stacked in this order is disposed to electrically connected to the nitride semiconductor layer which contains p-type dopants. Then, femto-second laser beam was irradiated on the wafer along the predetermined dividing lines and scribing was carried out.

Sample 2

Sample 2 was prepared in a similar manner as in Sample 1, except for annealing the wafer between the forming of step portion and the forming of the n-side electrode and the p-side electrode. Annealing is performed on the wafer 11 to reduce the resistance of the nitride semiconductor layer which contains the p-type dopants to form a p-type nitride semiconductor layer. The annealing was performed in a nitrogen atmosphere at a temperature about 400 to 600° C., with holding the wafer 11 for several tens of minutes.

Sample 3

Sample 3 was prepared in a same manner as in Sample 1, except for forming ITO as a transparent electrode on the nitride semiconductor layer which contains p-type dopants and annealing the wafer between the forming step-shaped portion and the forming the n-side electrode and the p-side electrode. In detail, after forming the step-shaped portion, ITO was disposed in contact with the nitride semiconductor layer which includes p-type dopants. Then, the wafer was subjected to annealing and the n-side electrode and the p-side electrode were respectively formed on the n-type nitride semiconductor layer at the step-shaped portion and on the ITO. The annealing was performed under similar conditions as in Sample 2.

Results

Photoluminescence (PL) measurements were conducted on Samples 1 to 3, before and after irradiating the laser beam on the wafer (laser scribing), and the rates of increase in damage to the nitride semiconductor layers were respectively calculated and compared. The rates of increase in damage to the nitride semiconductor layer were measured by counting the number of the damaged parts before and after the laser irradiation, and the increases in the percentage of damaged parts due to the irradiation of the laser beam were calculated based on the numbers of the damaged parts respectively. Sample 2 and Sample 3 differ in presence and absence of ITO, but the rates of increase in damage were 2.2% in Sample 2 and 2.9% in Sample 3, which indicates a significant increase in damage to the nitride semiconductor layers due to the irradiation of the laser beam on the wafer. On the other hand, the rate of increase in the damage in Sample 1 was 0.1%, which indicates little damage due to the irradiation of the laser beam. According the results, the damages to the nitride semiconductor layers due to the irradiation of the laser beam are thought to be due to laser scribing which was conducted after annealing the wafer, regardless of the materials of the electrodes.

The p-type dopants in the nitride semiconductor layer which contains p-type dopants are generally activated (forming a p-type nitride semiconductor layer) in annealing in which hydrogen in the nitride semiconductor layer which contains p-type dopants is detached to dehydronate. According to the experiment results described above, the inventors assumed that conducting laser scribing after annealing may damage the nitride semiconductor layer, which may induce absorption of laser beam by the activated (dehydrogenated) p-type dopants, and at higher energy density than threshold, the p-type nitride semiconductor layer with weaker crystal structure may be damaged.

Based on such assumption, the inventors have found that applying the laser irradiation on the nitride semiconductor layer which is in a state where the p-type dopants are not activated, or where small amount of the p-type dopants has been activated, allows suppression of absorption of laser beam by the p-type dopants, which can reduce the damage.

In the specification, the term "annealing" refers to a process to form a p-type to realize the nitride semiconductor element. For this, a part of the p-type dopants contained in the nitride semiconductor layer may be activated in a process prior to the annealing. It is preferable that the nitride semiconductor layer which contains a p-type dopants prior to laser irradiation has a sufficiently high electrical resistance so as not to function as a nitride semiconductor element.

EXAMPLES

Specific examples will be described below, while the present invention is not limited to those examples.

Example 1

As a nitride semiconductor element according to Example 1, a nitride semiconductor element 1 of 700 μm×300 μm in a top view as shown in FIG. 2 is fabricated. The nitride semiconductor element 1 includes an n-type nitride semiconductor layer of a Si-doped n-type GaN-based layer 21, an active layer 22, a p-type nitride semiconductor layer of a Mg-doped p-type GaN-based layer 23 in this order on a sapphire substrate 10. The Si-doped n-type GaN-based layer 21 has a step portion, and an n-side electrode 31 which is Ti/Rh/W/Au stacked in this order is disposed on the step-shaped portion. Meanwhile, on the Mg-doped p-type GaN-based layer 23, a whole surface electrode 32 made of ITO and a p-side electrode 33 which is Ti/Rh/W/Au stacked in this order is disposed.

A method of manufacturing a nitride semiconductor light emitting element 1 according to Example 1 will be described below. FIGS. 2 to 7 are schematic cross-sectional views illustrating a process of a method of manufacturing a nitride semiconductor element 1 according to Example 1 of the present invention.

First, as shown in FIG. 2, on a sapphire substrate 10 of 800 μm in thickness and 4 inches in size, a GaN-based layer which contains Si as n-type dopants (hereinafter may be referred to as "Si-doped n-type GaN-based layer) 21 of 8 μm in thickness, an active layer 22 of 0.07 μm in thickness, and a GaN-based layer which contains Mg as p-type dopants, hereinafter may be referred to as "Mg-doped GaN-based layer", 123 of 0.3 μm in thickness are stacked in this order, to form a nitride semiconductor layer 120, thus a wafer 11 having a nitride semiconductor layer 120 is obtained. Next, from a part of the surface of the nitride semiconductor layer 120, the Mg-doped GaN-based layer 123 and the active layer 22, and a portion of the Si-doped n-type GaN-based layer 21 are removed in the thickness direction by etching, to form a step-shaped portion in the Si-doped n-type GaN-based layer 21. As shown in FIG. 3, on the step-shaped portion, an n-side electrode 31 electrically connecting to the Si-doped n-type GaN layer 21 is formed by stacking Ti/Rh/W/Au in this order, and on the Mg-doped GaN-based layer 123, a whole surface electrode 32 electrically connecting to the Mg-doped GaN-based layer 123 is formed with ITO, and a p-side electrode 33 is formed on the whole surface electrode 32 by stacking Ti/Rh/W/Au in this order. Next, the upper surface of the wafer 11, except for the portions to be connected to an external power source (i.e. particularly the upper surface of the n-side electrodes 31 and the upper surface of the p-side electrodes 33) are connected with a protective layer. Then, as shown in FIG. 4, the sapphire substrate 10 is ground and polished to reduce the thickness of the wafer to 150 μm.

Next, as shown in FIG. 5, from the sapphire substrate 10 side which is opposite side from the nitride semiconductor layer 120 of the wafer 11, a femtosecond laser beam is focused along the predetermined dividing lines into the sapphire substrate 10, more specifically, the femtosecond laser beam is focused at each location 35 μm from the surface of the sapphire substrate 10 to conduct laser scribing. With this, an altered portion 41 is formed at each of the focused positions. In detail, the altered portions 41 are created individually at separate locations in the sapphire substrate 10, in a direction perpendicular to the staking direction of the nitride semiconductor layer 120. As shown in FIG. 6, cracks extending upward and downward are generated from those individual altered portions 41.

Next, after the laser scribing, the wafer 11 is annealed in a nitrogen atmosphere at about 400 to 600° C. By such configuration, hydrogen in the Mg-doped GaN-based layer 123 is detached to activate Mg, thus, the nitride semiconductor layer 20 which includes the Mg-doped p-type GaN-based layer 23 having a reduced resistance is obtained.

Then, as shown in FIG. 7, with the use of a breaking blade, an external force is applied on the wafer 11 from the sapphire substrate 10 side to divide the wafer 11 along the laser scribing lines (predetermined dividing lines), and thus, individual nitride semiconductor elements 1 are separated.

According to the method of manufacturing, nitride semiconductor elements 1 with the nitride semiconductor layers 20 which are effectively free from damage can be fabricated.

Moreover, damage to the nitride semiconductor layer 20 can be reduced, which allows an increase in output power and scanning speed of the laser beam. So that division of a thick wafer 11, or improvement in dividing and tact time can be expected.

As shown in the above, a semiconductor light emitting element and a method of manufacturing the semiconductor light emitting element are illustrated in accordance with the embodiments for carrying out the present invention, but the invention is not limited to the above description, and should be widely understood based on the scope of claims. Further, based on the above description, it will be apparent that various changes and modifications can be made therein without departing from the scope of the invention.

The present invention can be suitably used for manufacturing a light emitting diode (LED), a laser diode (LD), and an nitride semiconductor element, which can be used for a light source of lighting, display, optical communication, and OA (office automation) equipment. Particularly, nitride semiconductor elements obtained according to the present invention can be used for a point light source such as a downlight, a projector, a vehicle head light, and flash of a camera.

It should be noted that the present invention is not just limited only to these illustrative and exemplary.

As described above, it should be obvious that various other embodiments are possible without departing the spirit and scope of the present invention. Accordingly, the scope and spirit of the present invention should be limited only by the following claims.

This application claims priority to Japanese Patent Application No. 2013-223810 filed on Oct. 29, 2013. The entire disclosure of Japanese Patent Application No. 2013-223810 is incorporated herein by reference.

What is claimed is:

1. A method of manufacturing a nitride semiconductor element comprising:
   preparing a wafer having a nitride semiconductor layer which includes p-type dopants;
   subsequently forming an altered portion by focusing laser beam inside the wafer; and
   then annealing the wafer to form a p-type nitride semiconductor layer.

2. The method of manufacturing a nitride semiconductor element according to claim 1, wherein the forming the altered portion is conducted using a pulse laser having a pulse width of picosecond order or less.

3. The method of manufacturing a nitride semiconductor element according to claim 1, wherein the nitride semiconductor layer is disposed on the substrate, and in the forming altered portion, the laser beam is irradiated from the substrate side.

4. The method of manufacturing a nitride semiconductor element according to claim 3, wherein in the forming altered portion, the laser beam is focused on the substrate.

5. The method of manufacturing a nitride semiconductor element according to claim 1, wherein the wafer is divided using the altered portions.

6. The method of manufacturing a nitride semiconductor element according to claim 3, wherein the substrate is a sapphire substrate.

7. The method of manufacturing a nitride semiconductor element according to claim 1, wherein the p-type dopants are magnesium.

8. The method of manufacturing a nitride semiconductor element according to claim 1, wherein the wafer comprises a substrate, a nitride semiconductor layer which contains n-type dopants, and a nitride semiconductor layer which contains the p-type dopants in this order.

9. The method of manufacturing a nitride semiconductor element according to claim 2, wherein the nitride semiconductor layer is disposed on the substrate, and in the forming altered portion, the laser beam is irradiated from the substrate side.

10. The method of manufacturing a nitride semiconductor element according to claim 2, wherein the wafer is divided using the altered portions.

11. The method of manufacturing a nitride semiconductor element according to claim 9, wherein in the forming altered portion, the laser beam is focused on the substrate.

12. The method of manufacturing a nitride semiconductor element according to claim 9, wherein the wafer is divided using the altered portions.

13. The method of manufacturing a nitride semiconductor element according to claim 11, wherein the wafer is divided using the altered portions.

14. The method of manufacturing a nitride semiconductor element according to claim 11, wherein the substrate is a sapphire substrate.

15. The method of manufacturing a nitride semiconductor element according to claim 4, wherein the wafer is divided using the altered portions.

16. The method of manufacturing a nitride semiconductor element according to claim 4, wherein the substrate is a sapphire substrate.

17. The method of manufacturing a nitride semiconductor element according to claim 3, wherein the wafer is divided using the altered portions.

18. The method of manufacturing a nitride semiconductor element according to claim 17, wherein the substrate is a sapphire substrate.

19. The method of manufacturing a nitride semiconductor element according to claim 3, wherein the substrate is a sapphire substrate.

20. The method of manufacturing a nitride semiconductor element according to claim 1, wherein the forming the altered portion is conducted using a pulse laser having a pulse width of 100 femtoseconds to 500 nanoseconds.

21. The method of manufacturing a nitride semiconductor element according to claim 1, further comprising:
   mounting the nitride semiconductor element in a flip-chip manner on a mount.

22. The method of manufacturing a nitride semiconductor element according to claim 1, wherein a p-side electrode is disposed on and electrically connected to the p-type nitride semiconductor layer, the p-side electrode is made of Ag, Al, or Rh.

23. The method of manufacturing a nitride semiconductor element according to claim 1, wherein a p-side electrode is disposed on and electrically connected to the p-type nitride semiconductor layer, the p-side electrode is made of Ag.

* * * * *